(12) United States Patent
Ryken, Jr. et al.

(10) Patent No.: US 6,940,264 B2
(45) Date of Patent: Sep. 6, 2005

(54) NEAR FIELD PROBE

(75) Inventors: Marvin L. Ryken, Jr., Oxnard, CA (US); Albert F. Davis, Ventura, CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 33 days.

(21) Appl. No.: 10/769,669

(22) Filed: Jan. 29, 2004

(65) Prior Publication Data

US 2005/0168209 A1     Aug. 4, 2005

(51) Int. Cl.[7] ............................................. G01R 23/04
(52) U.S. Cl. ..................................... 324/95; 324/117 R
(58) Field of Search ........................... 324/95, 117 R, 324/117 H, 126, 686, 690, 754

(56) References Cited

U.S. PATENT DOCUMENTS

| 4,277,744 A | 7/1981 | Audone |
| 4,611,166 A * | 9/1986 | Aslan ........................... 324/95 |
| 5,231,346 A * | 7/1993 | Gassmann .................... 324/95 |
| 6,771,058 B2 * | 8/2004 | Lapinksi et al. ........ 324/117 R |

* cited by examiner

*Primary Examiner*—Minh N. Tang
(74) *Attorney, Agent, or Firm*—David S. Kalmbaugh

(57) ABSTRACT

A near field probe for testing installed components of an electromagnetic radiating system on a missile. The probe design comprises a diode antenna with a balun. The probe utilizes a dual diode arrangement which provides approximately twice the output voltage as the previous probe. The probe may then be placed further away from the radiating system under test.

20 Claims, 6 Drawing Sheets

NEAR FIELD PROBE

BACKGROUND OF THE INVENTION

1. Field of the Invention

The present invention relates generally to a probe for testing components of an electromagnetic radiating system. More specifically, the present invention relates to a near field probe in an antenna coupler that is designed to test installed components of an electromagnetic radiating system by coupling from the system to perform the test.

2. Description of the Prior Art

There is currently a need for a near field probe for use in testing installed components of an electromagnetic radiating system on the SM-1 missile. Specifically, the probe should be designed to provide an accurate voltage response as a function of frequency for the radiating system on the SM-1 missile when the probe is positioned in the SM-1 DC coupler.

The probe previously used to test the components of the radiating system for the SM-1 missile had serious reliability problems in that the probe's diode detectors would fail and were very expensive to replace. Further, there is no longer a manufacturer for the probe, necessitating a more reliable but less costly replacement for the probe.

SUMMARY OF THE INVENTION

The present invention overcomes some of the disadvantages of the prior art in that it comprises an inexpensive, highly reliable and very accurate near field probe for testing installed components of an electromagnetic radiating system on the SM-1 missile. The probe design comprises a dipole antenna with a balun. The probe utilizes a dual diode arrangement which provides approximately twice the output voltage as compared to the previous probe. The probe may then be placed further away from the antenna under test to achieve the same voltage output so that manufacturing tolerances are not critical. Since the output voltage is doubled, the previous probe's problem of providing a marginal voltage output is alleviated.

DETAILED DESCRIPTION OF A PREFERRED EMBODIMENT OF THE INVENTION

Figure 1:
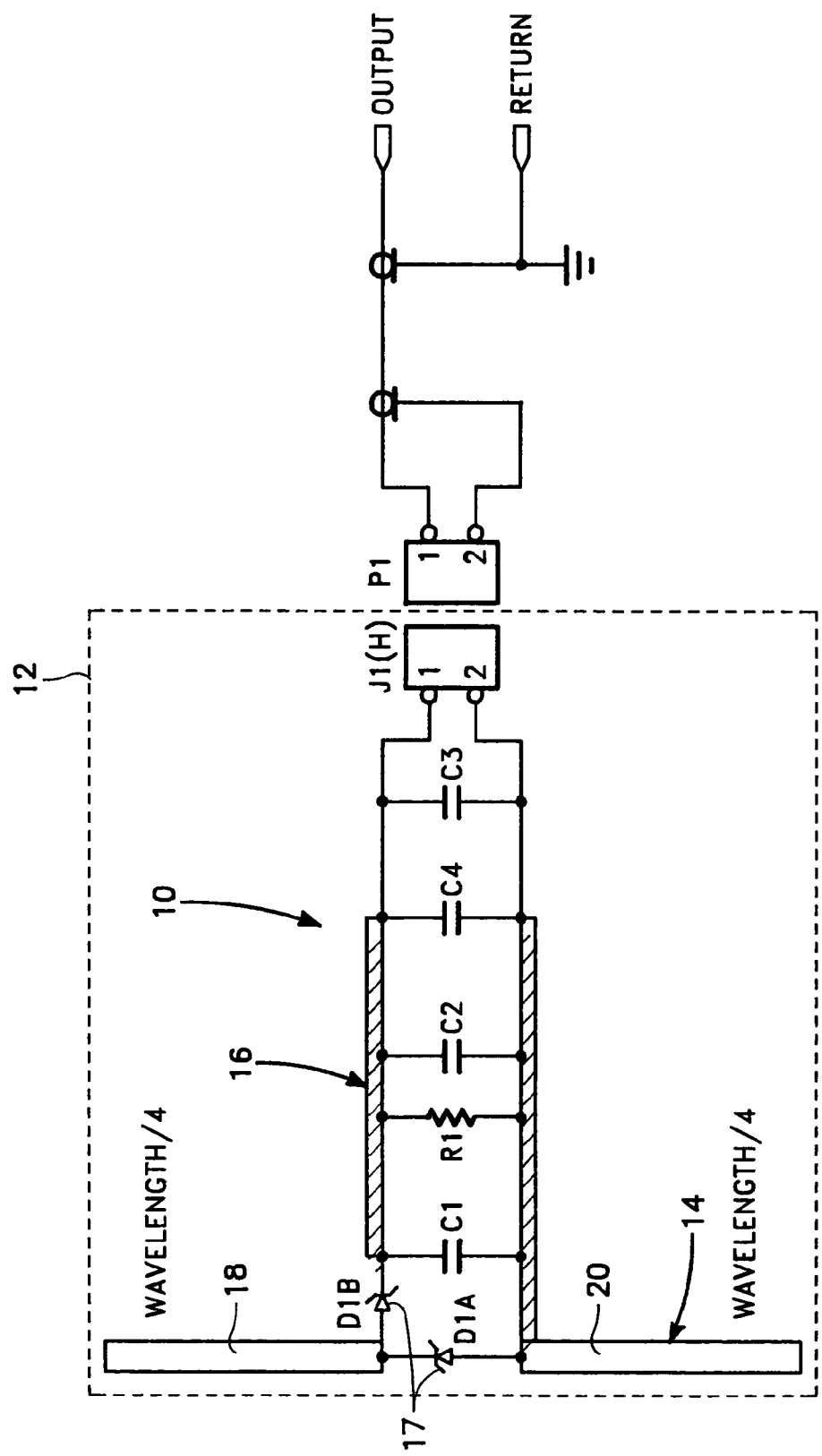
FIG. 1 is an electrical schematic diagram illustrating the near field probe comprising a preferred embodiment of the present invention.
Figure 3:
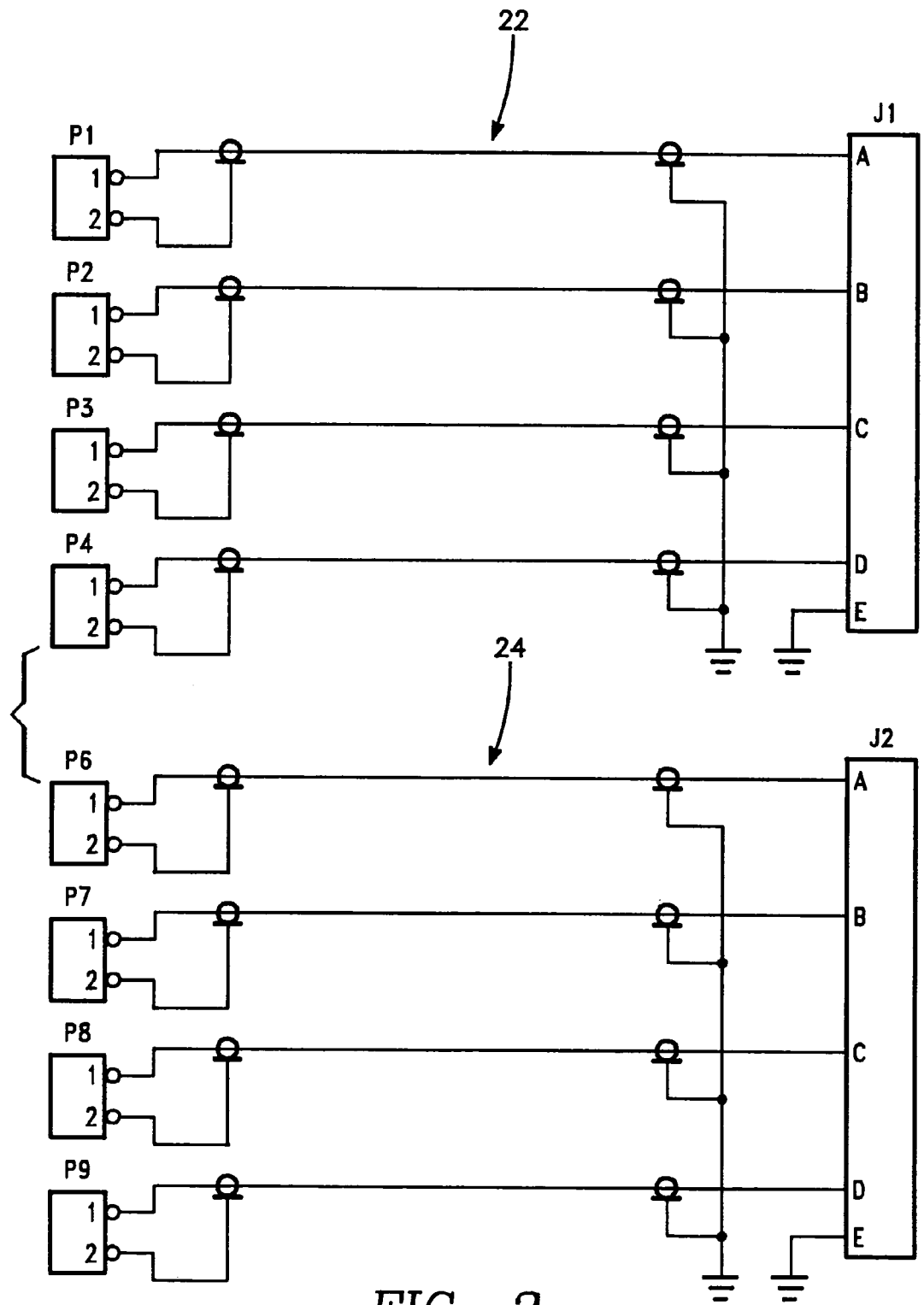
FIG. 3 is an electrical schematic diagram which shows the coax cables for the probe of FIG. 1 positioned inside of the SM-1 DC coupler which terminates with a pair of output connectors J1 and J2.

Referring first to FIGS. 1, and 3, there is shown a near field probe, designated generally by the reference numeral 10, for testing installed components of an electromagnetic radiating system on the SM-1 missile. The near field probe is mounted on microstrip printed circuit board 12.

The near field probe 10 includes a dipole antenna 14 having a balun 16. Balun 16, which is a transmission line transformer, is connected to header connector J1(H) of circuit board 12, pins 1 and 2, as shown in FIG. 1. Header connector J1(H) allows for ease of installation and removal of the antenna 14 of near field probe 10.

A diode detector 17 consisting of a pair of Schottky diodes D1A and D1B is integrated into near filed probe 10. The anode of diode D1A is connected to antenna element/dipole 20 of dipole antenna 14 and the cathode of diode D1A is connected to antenna element/dipole 18 of dipole antenna 14. The anode of diode D1B is connected to antenna element 18 of dipole antenna 14 and the cathode of diode D1A is connected to balun 16.

By utilizing diodes D1A and D1B configured as shown in FIG. 1, the output of near field probe 10 is approximately double that of the probe used in the past. This allows the user to place probe 10 further away from the antenna being tested to achieve the same voltage output so that manufacturing tolerances are not as critical. Since the output voltage is doubled by utilizing diodes D1A and D1B the problem of marginal voltage output is alleviated.

The near field probe 10 also includes a load resistor R1 mounted on printed circuit board 12 which eliminates two printed circuit boards by the connectors J1 and J2 (FIG. 3) used in previous couplers.

The probe diode antenna length is approximately a half wavelength consisting of antenna elements 18 and 20 with each antenna element approximately a quarter wavelength as shown in FIG. 1 Diode D1A rectifies one half of the RF (radio frequency) signal and this voltage is on the top side of the probe as shown in FIG. 1. Diode D1B and capacitor C1 rectify the other half of the RF signal. From an AC (alternating current) perspective, diodes D1A and D1B are in parallel connected across the two sides of the probe's dipole antenna which results in a symmetrical load. From a DC (direct current) perspective, the rectified voltage from diode D1A is added to the rectified voltage from diode D1B producing a voltage doubling of the DC voltage. Resistor R1 is the load resistor since the monitoring resistance does not contribute to the load because the monitoring resistance has substantially higher value than resistor R1.

A ground cannot be placed on either side of diodes D1A and D1B which necessitates the use of balun 16 to isolate the RF signal from a grounding position. Balun 16 has an efficiency of 98 to 99% which insures high signal strength for near filed probe 10. Capacitor C4 is positioned at the electrical signal output or the end of balun 16 to function as an AC short circuit.

The ground for the probe is placed at the connectors J1 and J2 in the manner illustrated in FIG. 3 to minimize ground loops. This ground potential is transmitted through coax cables 22 and 24 to one side of capacitor C4. Capacitor C3 is included in the near field probe 10 to integrate the electromagnetic or RF signal detected by probe 10 and reduces noise within the detected RF signal. Capacitors C1 and C4, which are 20 picofarad capacitors function better as RF short circuits than capacitor C3 which is a 0.01 microfarad capacitor with a higher impedance at RF. The load resistor R1 has a variable impedance value ranging from 137 ohms to 3.56K ohms.

Figure 2:
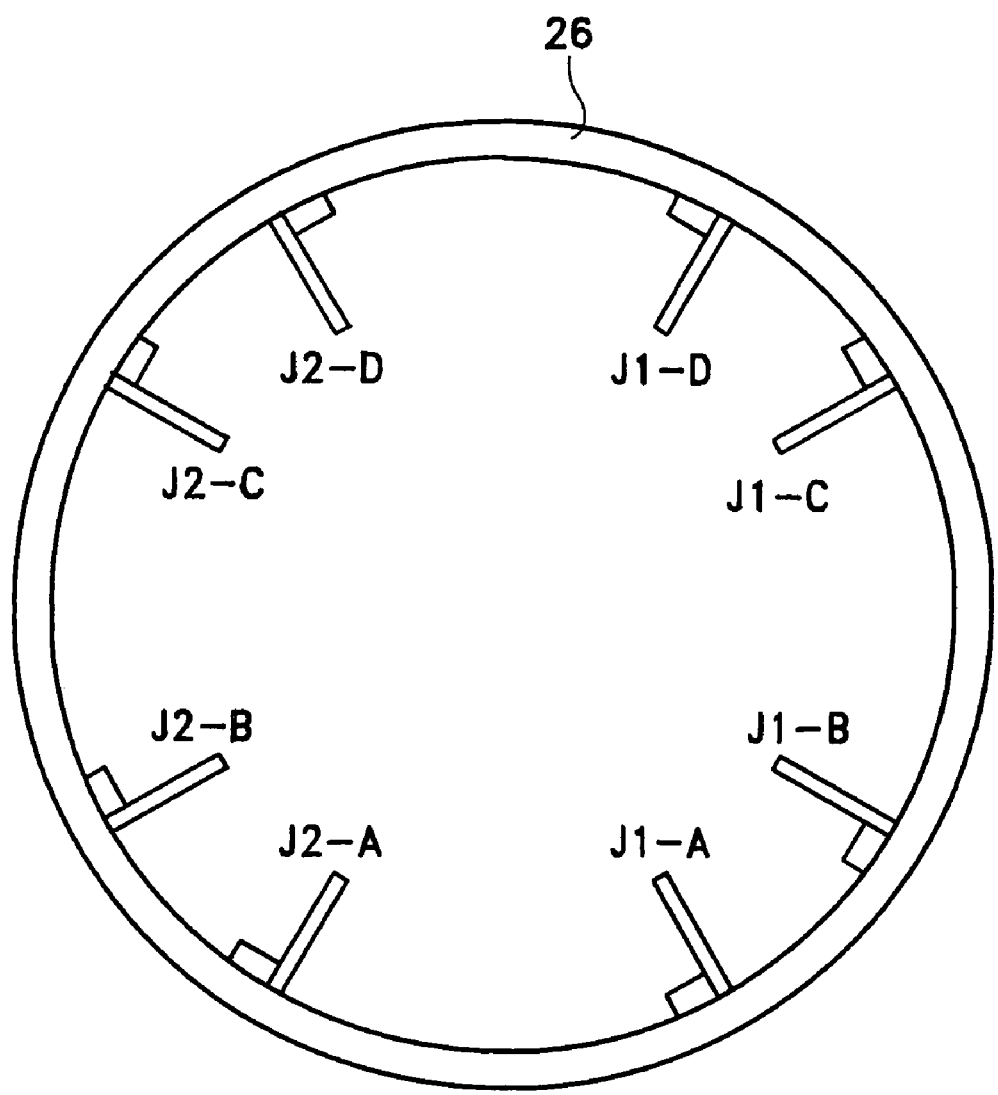
FIG. 2 is a view illustrating the connectors and probe antenna positions for the near field probe of FIG. 1.

Referring to FIGS. 2 and 3, FIG. 3 shows the coax cables 22 and 24 inside of the SM-1 DC coupler which terminates with output connectors J1 and J2. A lug is used to ground the return lines to an enclosure at one of the connector attachment screws. A view of the connectors and probe antenna positions is illustrated in FIG. 2.

Referring to FIGS. 1–4, FIG. 4 depicts a scaled drawing of the probe 10. The overall length of the probe is 2.50 inches and the width is 1.15 inches. The length of the dipole antenna 14 was adjusted to obtain the flattest response across the frequency being measured at each probe position. The left side and the right side of the dipole antenna were trimmed from the antenna's original length of 2.5 inches.

The probe 10 is fabricated using conventional and well known printed circuit board technology. A one ounce copper single side printed circuit mounted on a 0.062 inch thick FR4 epoxy fiberglass board.

Table I below sets forth the configuration for the probe verses position in the SM-1 DC coupler 26 with the positions being illustrated in FIG. 2. As shown in FIG. 2, six of the probes having mounting positions which are identical, while two of the probes having mounting positions which are reversed. This reversal occurs because of the design of coupler 26 and measuring system and provides for the best electrical performance by the probes. The left and right sides for the two reversed positions are different from the remaining probes which were not reversed.

TABLE I

Probe Configuration Versus Position

| Probe Position | Pin Connection | Probe Configuration | Load Resistor |
|---|---|---|---|
| 1 | J1-A | Trim 0.3" left 0.25" right | 143 |
| 2 | J1-B | No Trimming | 1.96K |
| 3 | J1-C | Trim 0.3" left 0.3" right | 221 |
| 4 | J1-D | No Trimming | 383 |
| 5 | J2-D | Trim 0.3" left 0.25" right | 137 |
| 6 | J2-C | No Trimming | 3.56K |
| 7 | J2-B | Trim 0.3" left 0.3" right | 301 |
| 8 | J2-A | Trim 0.3" left 0.25" right | 188 |

Figure 4:
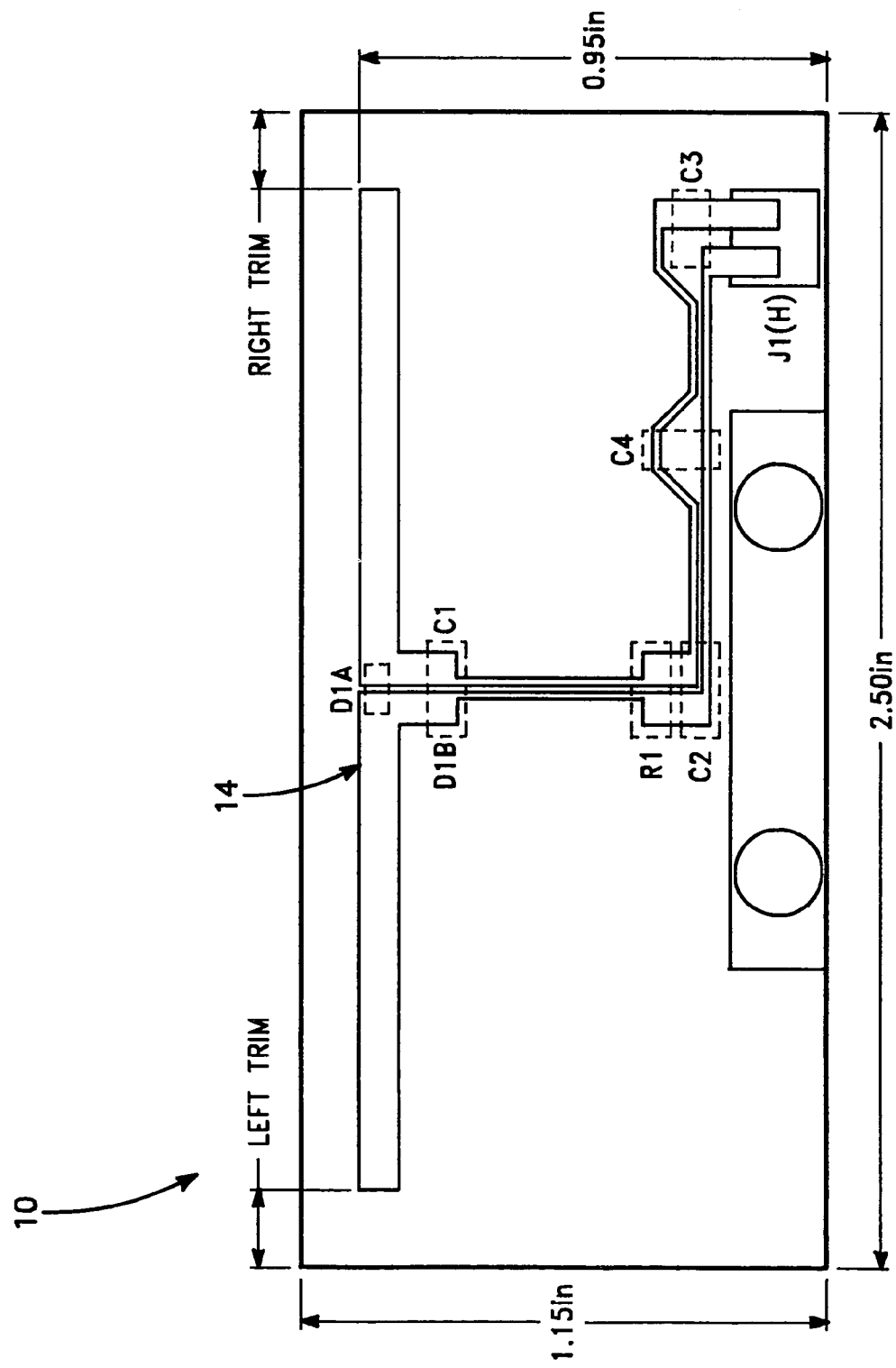
FIG. 4 depicts a scaled drawing of the near field probe of FIG. 1.

To test the near field probe, three models of the probe antenna were fabricated. The only difference in the probes was the height dimension of antenna which as shown in FIG. 4 is 0.95 inches. The other models had antenna height dimensions of 1.05 inches and 1.15 inches. The probe model illustrated in FIG. 4 provided the best response in terms of constant voltage across the frequency band under test and adequate magnitude of voltage. The probe model illustrated in FIG. 4 also allowed for maximum distance between the antenna being tested and the probe. This yields the best result with respect to alignment of the probe model illustrated in FIG. 4.

Two different dual diode models were used in the probe antennas. Models Numbers HSMS-2822 and HSMS-2862 dual diodes, commercially available from Hewlett-Packard of Palo Alto, Calif. were used in the design of the near field probe. The specifications for the dual diodes were similar except that the HSMS-2822 dual diode has a minimum breakdown voltage of 4 volts with a maximum capacitance of 1 picofarad while the HSMS-2862 dual diode has a minimum breakdown voltage of 4 15 volts with a maximum capacitance of 0.35 picofarads. High breakdown voltage is very desirable because of problems associated with diode failure. However, a lower breakdown voltage yields a smaller capacitance to minimize detected voltage variations versus frequency. It was found that the smaller capacitance of the HSMS-2862 dual diode did yield a little more detected voltage but did not significantly minimize voltage variation versus frequency when compared to the HSMS-2822 dual diode.

Accordingly, the HSMS-2822 dual diode was used in the design of near field probe 10 since there was more than sufficient voltage detected and the 15 volt breakdown voltage provides at least a seven times reliability margin over other diodes used. The HSMS-2822 dual diode were tested at power levels exceeding 10 watts with detected voltages in excess of 12 volts without any failures.

The following tuning test results are provides as to the tuning response at each probe position illustrated in FIG. 2 without a dielectric cover which was removed for ease in removing and replacing antenna probes.

Probe 10 electrically connected to connector J1-A (FIGS. 2 and 3) provided a good low-end frequency response, limited at the high end and the antenna was trimmed as shown in Table I to bring up the high end response.

Probe 10 electrically connected to connector J1-B (FIGS. 2 and 3) provided a good response, therefore no tuning was required.

Probe 10 electrically connected to connector J1-C (FIGS. 2 and 3) provided a very drop off at the high end of the frequency response, and the antenna was trimmed as shown in Table I to bring up the high end response.

Probe 10 electrically connected to connector J1-D (FIGS. 2 and 3) provided an unusual peak in the response at the center of the band but the response was acceptable, therefore no tuning was required.

Probe 10 electrically connected to connector J2-D (FIGS. 2 and 3) provided a good low-end frequency response, limited at the high end and the antenna was trimmed as shown in Table I to bring up the high end response.

Probe 10 electrically connected to connector J2-C (FIGS. 2 and 3) provided a good response, therefore no tuning was required.

Probe 10 electrically connected to connector J2-B (FIGS. 2 and 3) provided a good low-end frequency response, limited at the high end and the antenna was trimmed as shown in Table I to bring up the high end response.

Probe 10 electrically connected to connector J2-A (FIG. 3) provided a good low-end frequency response, limited at the high end and the antenna was trimmed as shown in Table I to bring up the high end response.

In addition, it was found that the probe (untrimmed) in free space yields a broad response that is centered at the frequency being measured.

The probe tests were run and the data taken is set forth in Tables II and III below with Table II being a test of the SM-1 DC coupler 26 without a dielectric cover and Table III being a test of the SM-1 DC coupler 26 with a dielectric cover. As is evident the test run with the dielectric cover is better, both in output voltage and in flatness across the frequency band.

TABLE II

Test Data at 1.7 watts without cover

| Freq. MHZ | Probe J1-A | Probe J1-B | Probe J1-C | Probe J1-D | Probe J2-D | Probe J2-C | Probe J2-B | Probe J2-A |
|---|---|---|---|---|---|---|---|---|
| 2212.5 | 1.87 | 1.99 | 2.99 | 1.96 | 1.98 | 1.48 | 2.83 | 2.19 |
| 2224.5 | 1.49 | 1.83 | 2.65 | 2.76 | 1.80 | 1.56 | 2.67 | 2.45 |
| 2232.5 | 1.31 | 1.52 | 2.47 | 3.17 | 1.65 | 1.37 | 2.47 | 2.48 |
| 2252.5 | 1.45 | 1.85 | 2.61 | 2.80 | 1.53 | 1.03 | 2.01 | 2.39 |
| 2262.5 | 1.53 | 1.77 | 2.56 | 2.03 | 1.55 | 0.98 | 1.82 | 2.28 |
| 2272.5 | 1.53 | 1.57 | 2.36 | 1.39 | 1.53 | 0.86 | 1.59 | 2.07 |
| 2272.5 | 1.52 | 1.59 | 2.27 | 1.23 | 1.51 | 0.84 | 1.50 | 1.97 |

TABLE III

Test Data at 1.7 watts with cover

| Freq. MHZ | Probe J1-A | Probe J1_B | Probe J1-C | Probe J1-D | Probe J2-D | Probe J2-C | Probe J2-B | Probe J2-A |
|---|---|---|---|---|---|---|---|---|
| 2212.5 | 2.07 | 2.84 | 3.07 | 2.24 | 2.16 | 2.30 | 3.48 | 2.45 |
| 2224.5 | 1.65 | 2.52 | 2.77 | 2.80 | 1.92 | 2.39 | 3.34 | 2.83 |
| 2232.5 | 1.53 | 2.17 | 2.70 | 2.95 | 1.71 | 2.38 | 3.14 | 2.93 |
| 2252.5 | 1.48 | 2.26 | 2.79 | 3.02 | 1.52 | 2.55 | 2.70 | 2.75 |
| 2262.5 | 1.59 | 2.59 | 2.69 | 2.45 | 1.62 | 2.76 | 2.44 | 2.52 |
| 2272.5 | 1.68 | 2.72 | 2.38 | 1.78 | 1.69 | 2.90 | 2.09 | 2.20 |
| 2272.5 | 1.71 | 2.84 | 2.24 | 1.57 | 1.69 | 2.95 | 1.96 | 2.07 |

The desired performance for the probe is to obtain a minimum of 1 volt at 1.7 watts. In general this was accomplished. The minimum voltage is significantly above 1 volt because the Coupler was tuned from 2.2 to 2.3 GHz and the 0.6 dB loss in the input cable was not added to the power output. The SM-1 DC coupler has a requirement that the antenna under test be measured at 4 watts and the data provided is set forth in Tables IV and V below.

TABLE IV

Test Data at 4.0 watts without cover

| Freq. MHZ | Probe J1-A | Probe J1-B | Probe J1-C | Probe J1-D | Probe J2-D | Probe J2-C | Probe J2-B | Probe J2-A |
|---|---|---|---|---|---|---|---|---|
| 2212.5 | 2.98 | 3.81 | 4.52 | 3.63 | 3.09 | 2.94 | 4.33 | 3.54 |
| 2224.5 | 2.43 | 3.73 | 4.06 | 4.88 | 2.84 | 3.15 | 4.10 | 3.93 |
| 2232.5 | 2.15 | 3.38 | 3.77 | 5.40 | 2.60 | 3.04 | 3.77 | 3.92 |
| 2252.5 | 2.39 | 3.92 | 3.97 | 4.95 | 2.48 | 3.09 | 3.19 | 3.80 |
| 2262.5 | 2.50 | 3.92 | 3.91 | 3.75 | 2.51 | 3.06 | 2.92 | 3.60 |
| 2272.5 | 2.48 | 3.61 | 3.61 | 2.67 | 2.44 | 2.78 | 2.55 | 3.24 |
| 2272.5 | 2.48 | 3.67 | 3.51 | 2.42 | 2.43 | 2.76 | 2.44 | 3.13 |

TABLE V

Test Data at 4.0 watts with cover

| Freq. MHZ | Probe J1-A | Probe J1-B | Probe J1-C | Probe J1-D | Probe J2-D | Probe J2-C | Probe J2-B | Probe J2-A |
|---|---|---|---|---|---|---|---|---|
| 2212.5 | 3.61 | 5.56 | 5.03 | 4.47 | 3.70 | 4.59 | 5.67 | 4.36 |
| 2224.5 | 2.92 | 5.01 | 4.61 | 5.43 | 3.33 | 4.87 | 5.47 | 5.01 |
| 2232.5 | 2.64 | 4.30 | 4.39 | 5.69 | 2.95 | 4.80 | 5.15 | 5.05 |
| 2252.5 | 2.69 | 4.99 | 4.58 | 5.98 | 2.74 | 5.25 | 4.62 | 4.72 |
| 2262.5 | 2.88 | 5.49 | 4.42 | 5.07 | 2.91 | 5.52 | 4.22 | 4.29 |
| 2272.5 | 3.00 | 5.63 | 3.93 | 3.81 | 2.97 | 5.60 | 3.66 | 3.74 |
| 2272.5 | 3.07 | 5.85 | 3.77 | 3.46 | 2.98 | 5.73 | 3.49 | 3.59 |

Figure 5:
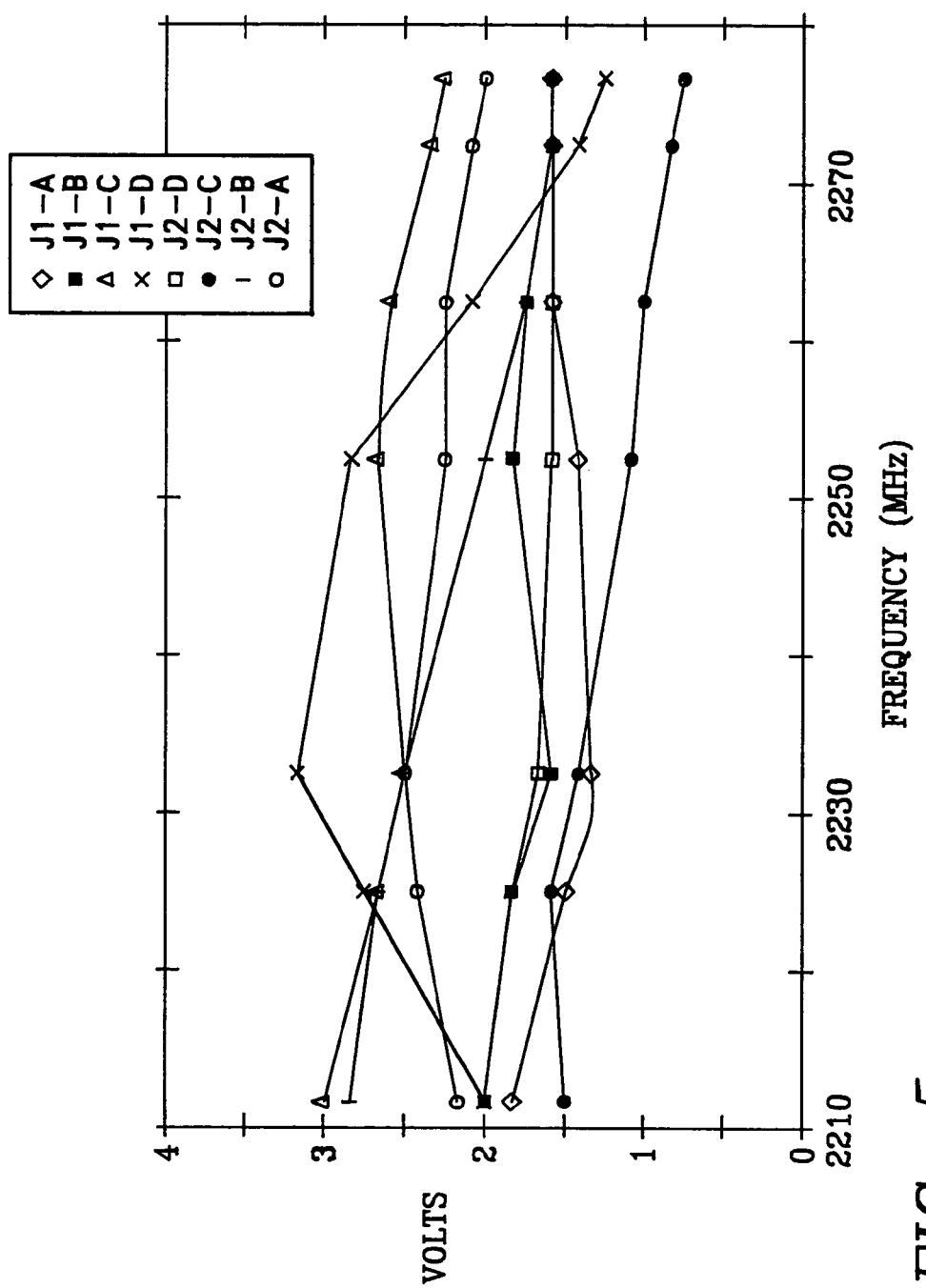
FIGS. 5 and 6 are plots illustrating frequency response curves for test data provided by the near field probe of FIG. 1.
Figure 6:
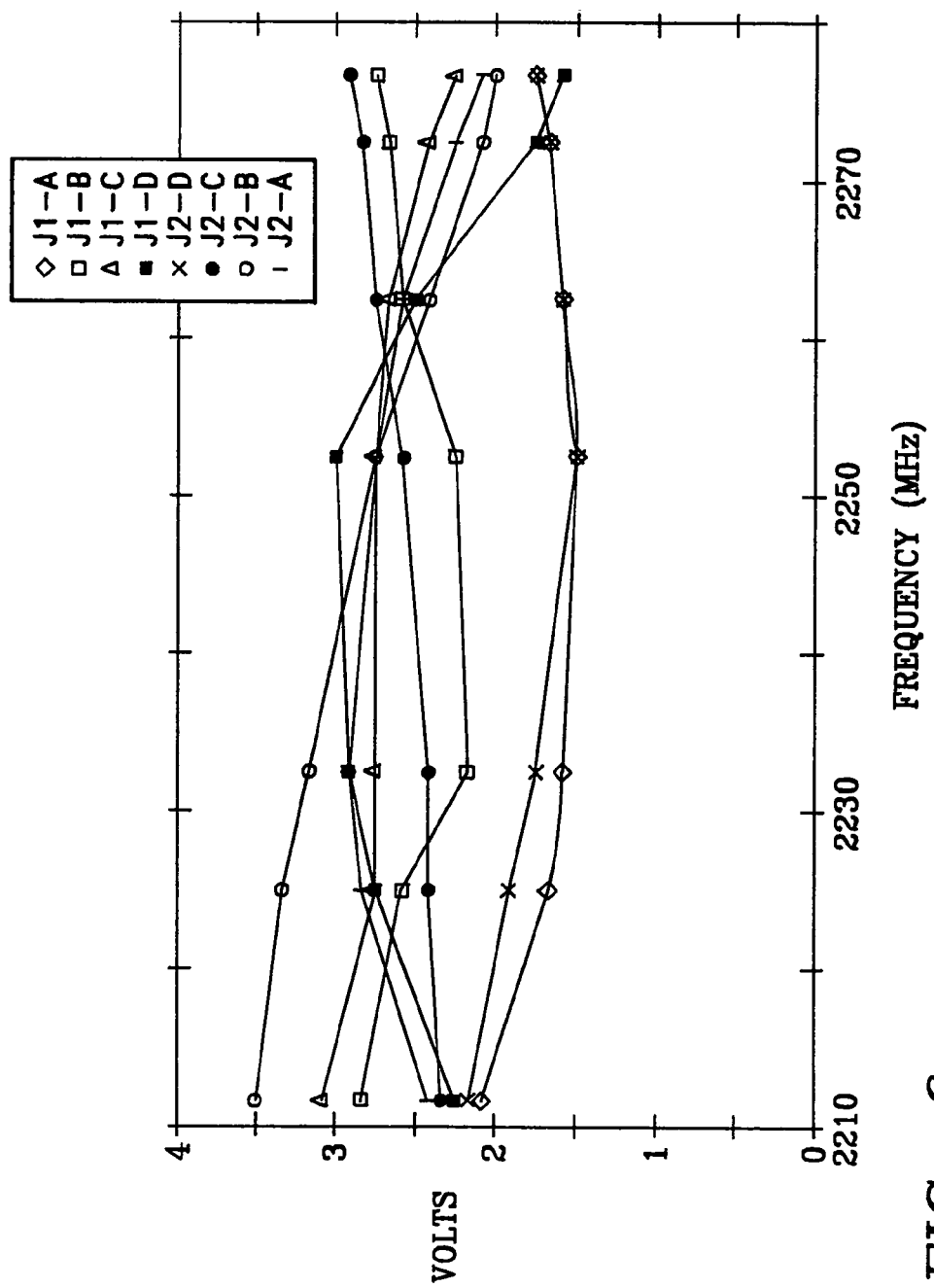

Referring to FIGS. 5 and 6, FIGS. 5 and 6 depict continuous test data versus frequency for the near field probe 10 where Tables II, III, IV and V are discrete points. Specifically, FIG. 5 illustrates the data which was measured for a coupler without a dielectric cover and FIG. 6 illustrates the data which was measured for a coupler with a dielectric cover.

From the foregoing, it is readily apparent that the present invention comprises a new, unique and exceedingly useful near field probe which constitutes a considerable improvement over the known prior art. Many modifications and variations of the invention are possible in light of the above teachings. It is therefore to be understood that within the scope of the appended claims that the invention may be practiced otherwise than as specifically described.

What is claimed is:

1. A near field probe comprising:
   an antenna having a first dipole and a second dipole for measuring an electromagnetic field, said antenna producing an electrical signal having an output voltage indicative of a field strength for said electromagnetic field;
   a first diode having an anode connected to the first dipole of said antenna and a cathode connected to the second dipole of said antenna;
   a second diode having an anode connected to the second dipole of said antenna and a cathode;
   a first capacitor having a first terminal connected to the cathode of said second diode and a second terminal, wherein said first diode, said second diode and said first capacitor double the output voltage of the electrical signal produced by said antenna;
   a transmission line transformer having an electrical signal input connected to the cathode of said second diode and the second terminal of said first capacitor, said transmission line transformer isolating said electrical signal from ground providing a signal strength efficiency of approximately ninety eight percent.

2. The near field probe of claim 1 wherein said first diode and said second diode comprise Schottky diodes.

3. The near field probe of claim 1 further comprising a second capacitor having first and second terminals connected to an electrical signal output for said transmission line transformer, said second capacitor operating as an alternating current short circuit when said second capacitor is positioned at the electrical signal output for said transmission line transformer.

4. The near field probe of claim 3 further comprising a third capacitor having first and second terminals connected to the electrical signal output for said transmission line transformer, said third capacitor integrating said electrical signal and reducing noise within said electrical signal.

5. The near field probe of claim 3 wherein said second capacitor is a twenty picofarad capacitor.

6. The near field probe of claim 4 wherein said third capacitor is a 0.01 microfarad capacitor.

7. The near field probe of claim 1 further comprising a load resistor connected to said transmission line transformer, said load resistor having an impedance which varies from about 137 ohms to about 3.56 k-ohms.

8. The near field probe of claim 1 wherein said first capacitor is a twenty picofarad capacitor.

9. The near field probe of claim 1 wherein said near field probe provides an output voltage reading of 0.84 volts to 3.17 volts over a frequency range of 2212.5 MHz–2276.5 MHz when the electromagnetic field generated by an antenna coupler being tested has a power requirement of 1.7 watts.

10. The near field probe of claim 1 wherein said near field probe provides an output voltage reading of 2.15 volts to 5.40 volts over a frequency range of 2212.5 MHz–2276.5 MHz when the electromagnetic field generated by an antenna coupler being tested has a power requirement of 4.0 watts.

11. A near field probe comprising:
   a dipole antenna having a first dipole and a second dipole for measuring an electromagnetic field, said dipole antenna producing an electrical signal having an output voltage indicative of a field strength for said electromagnetic field;

a first Schottky diode having an anode connected to the first dipole of said dipole antenna and a cathode connected to the second dipole of said dipole antenna;

a second Schottky diode having an anode connected to the second dipole of said dipole antenna and a cathode;

a first capacitor having a first terminal connected to the cathode of said second Schottky diode and a second terminal;

a transmission line transformer having an electrical signal input connected to the cathode of said second Schottky diode and the second terminal of said first capacitor;

said first Schottky diode rectifying one half of said electrical signal;

said second Schottky diode and said first capacitor rectifying another half of said electrical signal doubling the output voltage of the electrical signal produced by said dipole antenna;

said transmission line transformer isolating said electrical signal from ground providing a signal strength efficiency of approximately ninety eight percent; and a second capacitor having first and second terminals connected to an electrical signal output for said transmission line transformer, said second capacitor operating as an alternating current short circuit when said second capacitor is positioned at the electrical signal output for said transmission line transformer.

12. The near field probe of claim 11 further comprising a third capacitor having first and second terminals connected to the electrical signal output for said transmission line transformer, said third capacitor integrating said electrical signal and reducing noise within said electrical signal.

13. The near field probe of claim 11 wherein said second capacitor is a twenty picofarad capacitor.

14. The near field probe of claim 12 wherein said third capacitor is a 0.01 microfarad capacitor.

15. The near field probe of claim 11 further comprising a load resistor connected to said transmission line transformer, said load resistor having an impedance which varies from about 137 ohms to about 3.56 k-ohms.

16. The near field probe of claim 11 wherein said first capacitor is a twenty picofarad capacitor.

17. The near field probe of claim 11 wherein said near field probe provides an output voltage reading of 0.84 volts to 3.17 volts over a frequency range of 2212.5 MHz–2276.5 MHz when the electromagnetic field generated by an antenna coupler being tested has a power requirement of 1.7 watts.

18. The near field probe of claim 11 wherein said near field probe provides an output voltage reading of 2.15 volts to 5.40 volts over a frequency range of 2212.5 MHz–2276.5 MHz when the electromagnetic field generated by an antenna coupler being tested has a power requirement of 4.0 watts.

19. A near field probe comprising:

a dipole antenna having a first dipole and a second dipole for measuring an electromagnetic field, said dipole antenna producing an electrical signal having an output voltage indicative of a field strength for said electromagnetic field;

a first Schottky diode having an anode connected to the first dipole of said dipole antenna and a cathode connected to the second dipole of said dipole antenna;

a second Schottky diode having an anode connected to the second dipole of said dipole antenna and a cathode;

a first capacitor having a first terminal connected to the cathode of said second Schottky diode and a second terminal, wherein said first capacitor is a twenty picofarad capacitor;

a transmission line transformer having an electrical signal input connected to the cathode of said second Schottky diode and the second terminal of said first capacitor;

said first Schottky diode rectifying one half of said electrical signal;

said second Schottky diode and said first capacitor rectifying another half of said electrical signal doubling the output voltage of the electrical signal produced by said antenna;

said transmission line transformer isolating said electrical signal from ground providing a signal strength efficiency of approximately ninety eight percent;

a load resistor connected to said transmission line transformer, said load resistor having an impedance which varies from about 137 ohms to about 3.56 k-ohms; and a second capacitor having first and second terminals connected to an electrical signal output for said transmission line transformer, said second capacitor operating as an alternating current short circuit when said second capacitor is positioned at the electrical signal output for said transmission line transformer, wherein said second capacitor is a twenty picofarad capacitor.

20. The near field probe of claim 19 further comprising a third capacitor having first and second terminals connected to the electrical signal output for said transmission line transformer, said third capacitor integrating said electrical signal and reducing noise within said electrical signal, said third capacitor being a 0.01 microfarad capacitor.

* * * * *